US006484300B1

(12) United States Patent
Kim et al.

(10) Patent No.: US 6,484,300 B1
(45) Date of Patent: Nov. 19, 2002

(54) SYSTEMS, METHODS AND COMPUTER PROGRAM PRODUCTS FOR OBTAINING AN EFFECTIVE PATTERN DENSITY OF A LAYER IN AN INTEGRATED CIRCUIT, AND FOR SIMULATING A CHEMICAL-MECHANICAL POLISHING PROCESS USING THE SAME

(75) Inventors: Yoo-hyon Kim, Seoul (KR); Kwang-jai Yoo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 126 days.

(21) Appl. No.: 09/597,120

(22) Filed: Jun. 20, 2000

(30) Foreign Application Priority Data

Jun. 21, 1999 (KR) .......................................... 99-23280

(51) Int. Cl.$^7$ .............................................. G06F 17/50
(52) U.S. Cl. ................................. 716/7; 716/4; 716/19
(58) Field of Search ........................ 716/7–12, 13–14, 716/17, 19–20, 21, 2–4, 15–16, 18

(56) References Cited

U.S. PATENT DOCUMENTS

| 5,552,996 | A | | 9/1996 | Hoffman et al. ............... 716/19 |
| 5,790,417 | A | * | 8/1998 | Chao et al. ............ 250/492.22 |
| 5,923,563 | A | * | 7/1999 | Lavin et al. ................... 716/19 |
| 6,109,775 | A | * | 8/2000 | Tripathi et al. ................ 703/10 |
| 6,189,130 | B1 | * | 2/2001 | Gofman et al. ................. 716/7 |

OTHER PUBLICATIONS

Stine et al., Rapid Characterization and Modeling of Pattern–Dependent Variation in Chemical–Mechanical Polishing, IEEE Transactions on Semiconductor Manufacturing, vol. 11, No. 1, Feb. 1998, pp. 129–140.

Tung, A Method for Die–Scale Simulation of CMP Planarization, 19 International Conference on Simulation of Semiconductor Processes and Devices, 1997, pp. 65–68.

Takahashi et al., Modeling of Chemical Mechanical Polishing Process for Three–Dimensional Simulation, 1997 Symposium on VLSI Technology Digest of Technical Papers, 1997, pp. 25–26.

* cited by examiner

Primary Examiner—Matthew Smith
Assistant Examiner—Paul Dinh
(74) Attorney, Agent, or Firm—Myers Bigel Sibley & Sajovec

(57) ABSTRACT

Embodiments of the present invention can provide systems, methods and/or computer program products that can obtain an effective pattern density of a layer of an integrated circuit from layout data that defines the layout. A grid of pattern cells is defined for the layout data. A respective pattern density is determined for a respective the pattern cell in the grid. An effective pattern density is calculated for a first pattern cell in the grid. The effective pattern density for the first pattern cell is a function of the pattern density of at least second pattern cell in the grid that is remote from (i.e. nonadjacent) the first pattern cell, and a distance of the at least a second pattern cell from the first pattern cell. Adjacent cells also may be included, and preferably are included, in the effective pattern density.

42 Claims, 14 Drawing Sheets

PATTERN

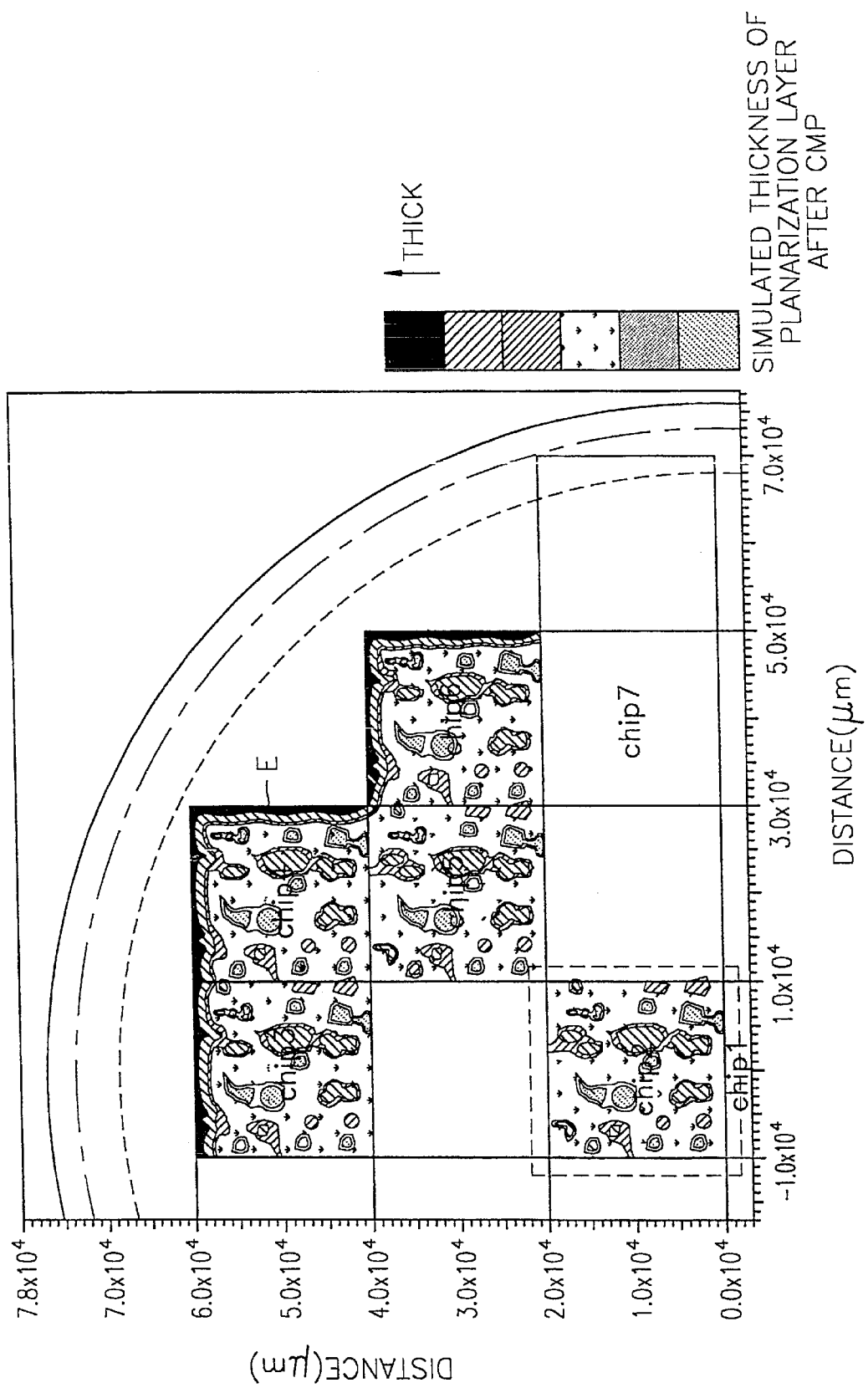

SYSTEMS, METHODS AND COMPUTER PROGRAM PRODUCTS FOR OBTAINING AN EFFECTIVE PATTERN DENSITY OF A LAYER IN AN INTEGRATED CIRCUIT, AND FOR SIMULATING A CHEMICAL-MECHANICAL POLISHING PROCESS USING THE SAME

FIELD OF THE INVENTION

This invention relates to systems, methods and computer program products for designing, testing and fabricating integrated circuits, and more particularly to systems, methods and computer program products for determining a density of a pattern in an integrated circuit and for simulating a chemical-mechanical polishing process using the density that was determined.

BACKGROUND OF THE INVENTION

Present-day Ultra-Large Scale Integration (ULSI) integrated circuits may include hundreds, thousands or millions of interconnected active and passive electronic devices in an integrated circuit chip. The large capital investment to fabricate and test these ULSI circuits prior to sale, and the difficulty, expense and/or loss of goodwill associated with reworking and replacing integrated circuits that fail to operate as planned, have increased the need to accurately simulate the design and fabrication of integrated circuits prior to their fabrication.

In fabricating integrated circuit devices, a plurality of patterned layers, such as wiring layers, generally are formed on a wafer. The patterned layer may cause a relative height difference, often referred to as a step difference, between the patterned and non-patterned areas of the layer. This step difference may increase with the number of layers that are formed, the fineness of the pattern and/or the increase in the level of integration. As is well known to those having skill in the art, an increased step difference can cause failure in many individual integrated circuit fabrication steps, and may also degrade the operating characteristics of the integrated circuit. Accordingly, it is known to provide planarization technology to reduce and preferably minimize the step differences that occur during fabrication of an integrated circuit. Chemical-mechanical polishing (CMP) is a widely used planarization technology.

CMP may be carried out using an apparatus such as that shown in FIG. 1 to planarize integrated circuits as shown in FIGS. 2A and 2B. Referring to FIG. 1, a wafer containing integrated circuits to be planarized is mounted on a wafer carrier 150. As shown in FIG. 2A, the wafer may include an integrated circuit substrate 210 on which a patterned layer 220, such as a metal wiring layer is formed. A planarization layer 230 is formed on the patterned layer 220. In order to perform the CMP process, the wafer carrier 150 is rotated about an axis 160, while a platen 120 on which a polishing pad 110 is mounted, also is rotated about an axis 130. A polishing slurry 170 is disposed on the polishing pad 110, so that the wafer 140 is exposed to a chemical polishing process, in addition to the mechanical polishing due to the friction between the polishing pad 110 and the wafer 140. By performing CMP for a predetermined period of time, the thickness of the planarization layer 230 of FIG. 2A may be reduced, resulting in a polished planarization layer 235, as shown in FIG. 2B, that is generally more planar than the initial planarization layer 230 of FIG. 2A.

Unfortunately, the results of a CMP process may vary depending on several parameters including polishing time, velocity of the platen 120, velocity of the wafer carrier 150, downward polishing pressure of the wafer 140 on the polishing pad 110, and/or the elastic modulus of the polishing pad 110. Accordingly, in certain cases, the CMP may cause a dishing phenomenon (portion A of FIG. 2B) to occur where a region of the planarization layer 235 without a pattern is depressed, or may cause a thinning phenomenon (portion B of FIG. 2B) to occur where fine patterns are polished by the CMP. Accordingly, it is desirable to improve and preferably optimize the above-parameters, to reduce and preferably minimize dishing and/or thinning. Unfortunately, the optimization of these parameters may be a difficult and time consuming task, which may require numerous test runs of the CMP process.

Thus, in order to reduce the time and/or labor involved in determining the parameters through multiple CMP test trials, analytical modeling or simulation using computers has been devised. However, such analytical modeling or simulation should provide accurate prediction within a reasonable time.

U.S. Pat. No. 5,552,996 to Hoffman et al. describes a method and system that can facilitate the control of an IC chip fabrication level of an IC chip fabrication process based upon the design pattern of the IC chip being fabricated. A grid having multiple sections is imposed over the design pattern of a fabrication level of the IC chip. Then, pattern density values are automatically established for the design pattern contained in each section of the grid. The IC chip fabrication level is then controlled based upon the pattern density values. For example, the established pattern density values facilitate the automatic determination of a CMP process stop parameter, or the automatic compensation for etch rate variations caused by pattern density differences across the design pattern of the IC chip.

Moreover, a publication by Takahashi et al. entitled *Modeling of Chemical Mechanical Polishing Process for Three-Dimensional Simulation*, 1997 Symposium on VLSI Technology, June 1997, pp. 25–26, describes a new model of CMP planarization. Machine time of actual calculation can be estimated less than $\frac{1}{100}$ of Finite Element Method and the simulation is in excellent agreement with experimental results. This model provides a physical image of planarization for three-dimensional surface profile during CMP. Furthermore, an optimized LSI chip layout or an appropriate processing condition can be estimated. In particular, this method can incorporate the data from adjacent meshes that surround a specified mesh.

Notwithstanding the above discussion, there continues to be a need for systems, methods and/or computer program products that can accurately simulate CMP results. Moreover, conventional simulators may carry out simulations on an integrated circuit chip level of a wafer, rather than over the entire wafer. Because tens or more of integrated circuit chips are repeatedly fabricated with the same pattern in a wafer, the CMP results over the entire wafer may be predicted based on the CMP results with respect to only one chip. However, wafers may be asymmetric due to a flat zone thereof, and/or the different patterns that may exist at the wafer periphery, where integrated circuits are not found.

SUMMARY OF THE INVENTION

Embodiments of the present invention can provide systems, methods and/or computer program products that can obtain an effective pattern density of a layer of an integrated circuit from layout data that defines the layout. A grid of pattern cells is defined for the layout data. A respective pattern density is determined for a respective pattern cell in the grid. An effective pattern density is calculated for a first pattern cell in the grid. The effective pattern density for the first pattern cell is a function of the pattern density of at least a second pattern cell in the grid that is remote from (i.e. nonadjacent) the first pattern cell, and a distance of the at least a second pattern cell from the first pattern cell. Adjacent cells also may be included and preferably are included, in the effective pattern density.

In other embodiments, a weighted average pattern density of a plurality of pattern cells in the grid around the first pattern cell and including the second pattern cell is calculated, that is inversely weighted as a function of the respective distances of the plurality of pattern cells from the first pattern cell. In yet other embodiments, the respective patterned densities of the respective plurality of pattern cells is multiplied by a weighted value that is inversely proportional to respective distances of the plurality of pattern cells from the first pattern cell and by the pattern density of the first pattern cell, to obtain a respective weighted pattern density for a respective one of the plurality of pattern cells. The respective weighted pattern densities are summed and divided by the number of cells in the selected plurality of pattern cells, to obtain the effective pattern density of the first pattern cell.

In still other embodiments, the pattern densities may be scaled as a function of fabrication processes that are used to fabricate the integrated circuit. Scaling may be performed by changing a pattern width and/or by multiplying a pattern density by a scaling factor based on the fabrication processes that are used to fabricate the integrated circuit.

Other embodiments of the present invention can determine the thickness of the planarization layer as a function of CMP polishing time, based on the effective pattern density. Moreover, in determining the thickness of the planarization layer as a function of CMP polishing time, at least one of the parameters may vary as a function of location of the integrated circuit in the wafer. These parameters therefore may be determined as a function of the location of the integrated circuit in the wafer.

According to yet other embodiments of systems, methods and/or computer program products according to the present invention, a layout which defines a pattern of the patterned layer is divided into a plurality of pattern cells. A percentage of the pattern occupying area in each pattern cell is computed as the pattern density of each pattern cell. Then, the effects of patterns of peripheral pattern cells on the pattern density of a selected cell are computed, for each of the pattern cells, as a function of the distances of respective peripheral cells from the selected pattern cell, to obtain an effective pattern density for each of the pattern cells based on the computed distances. When CMP is performed on a planarization layer, stacked on the patterned layer, the thickness and/or the step difference distribution of the planarization layer in the integrated circuit in accordance with the polishing time are computed based on the effective pattern density of each pattern cell in which the effects of patterns of the peripheral pattern cells has been reflected.

In yet other embodiments, a pattern may be extended and/or reduced based on the fabrication process that is used for the planarization layer. Accordingly, scaling may be used to evenly extend and/or reduce the pattern prior to computing the pattern density of each pattern cell, or multiplying the pattern density of each pattern cell by a predetermined scaling factor after computing the pattern density of each pattern cell.

In still other embodiments, the thickness and/or the step difference distribution of a planarization layer, which has been computed by an integrated circuit chip level simulation, can be extended to across an entire wafer that includes a plurality of integrated circuit chips. In one embodiment, the relative velocity V of the wafer with respect to a polishing pad, and the pressure P of the polishing pad on the wafer, which can vary in accordance with the position of each chip in the wafer, are computed. The computed parameters are then substituted into an equation used to calculate the thickness of a planarization layer in a chip, so that the thickness and/or the step difference distribution of the planarization layer in each chip of the wafer can be calculated with respect to the positions of each chip within the wafer.

In yet other embodiments, a CMP stop time and/or a monitoring point can be determined, based on the thickness and the step difference distribution of the planarization layer, which have been computed at a chip and/or wafer level. Alternatively, a dummy pattern for compensation of the step difference can be established, so that the results of the simulation can be reflected in the design of the integrated circuit.

Accordingly, the thickness of a planarization layer after CMP can be predicted accurately by using a pattern density which has been calculated in consideration of the effects of patterns of the remote (nonadjacent) pattern cells, and also preferably adjacent pattern cells, as a function of the distances between each cell and the remote pattern cells. Also, the CMP simulation performed at a chip level can be extended to a wafer level.

BRIEF DESCRIPTION OF THE DRAWINGS

FIG. 9B shows the thickness distribution of a planarization layer in each cell after CMP, which is simulated by embodiments of the present invention at a wafer level.

DETAILED DESCRIPTION OF THE PREFERRED EMBODIMENTS

Figure 1:
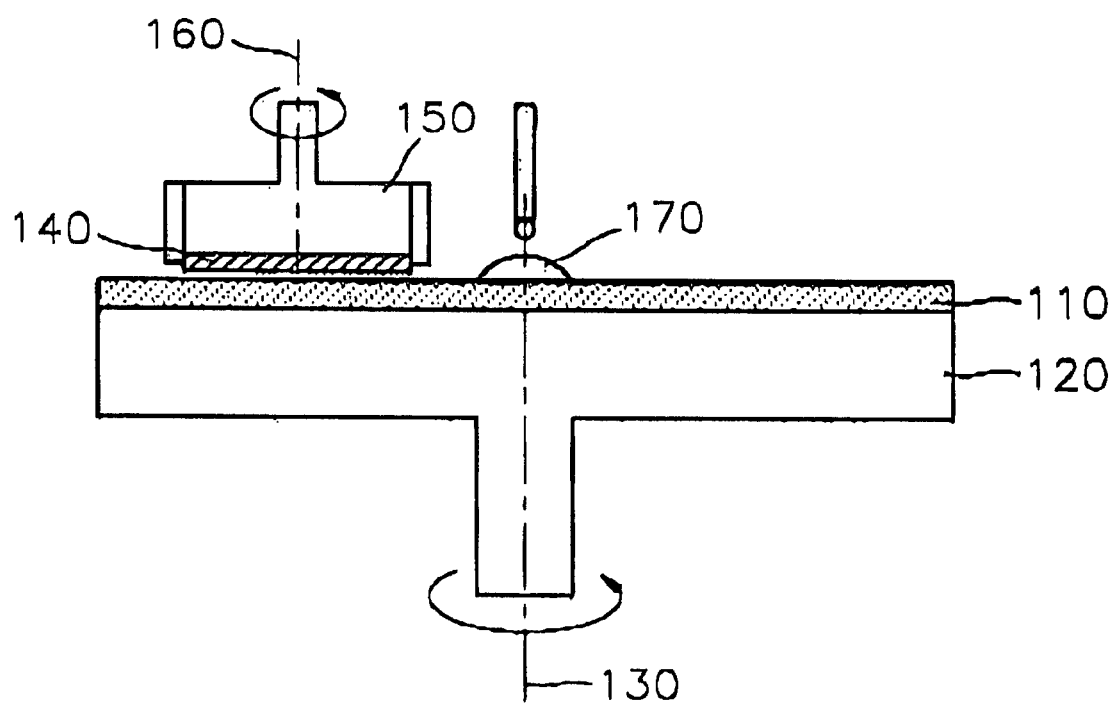
FIG. 1 is a schematic view of a general chemical-mechanical polishing (CMP) apparatus.
Figure 2A:
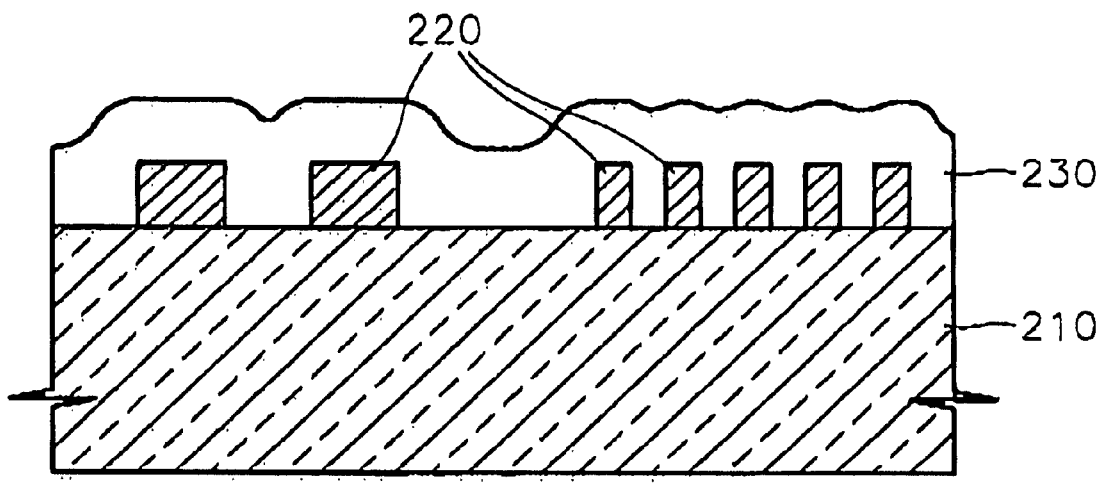
FIGS. 2A and 2B are cross-sectional views illustrating a planarization layer stacked on a predetermined pattern before CMP, and a resultant structure after CMP, respectively.
Figure 2B:
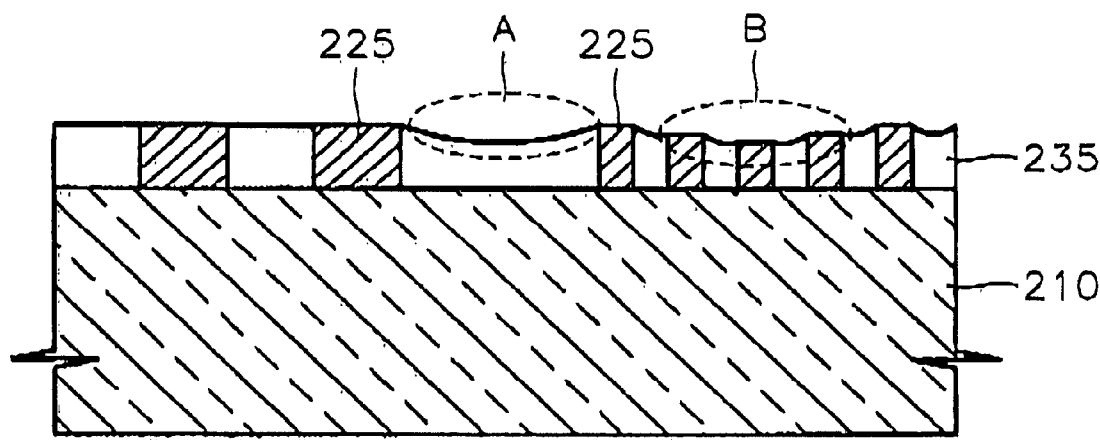

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

As will be appreciated by one of skill in the art, the present invention may be embodied as methods, systems (apparatus), and/or computer program products. Accordingly, the present invention may take the form of an entirely hardware embodiment, an entirely software embodiment running on general purpose hardware or an embodiment combining software and hardware aspects. Furthermore, the present invention may take the form of a computer program product on a computer-readable storage medium having computer-readable program code embodied in the medium. Any suitable computer readable medium may be utilized including hard disks, CD-ROMs, optical storage devices, magnetic storage devices, and/or carrier waves such as transmission over the Internet.

Various aspects of the present invention are illustrated in detail in the following Figures, including flowchart illustrations and/or block diagrams. It will be understood that each block of the flowchart illustrations and/or block diagrams and/or combinations of blocks in the flowchart illustrations and/or block diagrams, can be implemented by computer program instructions. These computer program instructions may be provided to a processor or other programmable data processing apparatus to produce a machine, such that the instructions which execute on the processor or other programmable data processing apparatus create means for implementing the functions specified in the block or blocks. These computer program instructions also may be stored in a computer-readable memory that can direct a processor or other programmable data processing apparatus to function in a particular manner, such that the instructions stored in the computer-readable memory produce an article of manufacture including instruction means which implement the functions specified in the flowchart and/or block diagram block or blocks.

Accordingly, blocks of the illustrations support combinations of means for performing the specified functions, combinations of steps for performing the specified functions and program instructions for performing the specified functions. It will also be understood that each block of the illustrations, and combinations of blocks in the illustrations, can be implemented by special purpose hardware-based computer systems which perform the specified functions or steps, or by combinations of special purpose hardware and computer instructions.

Figure 3A:
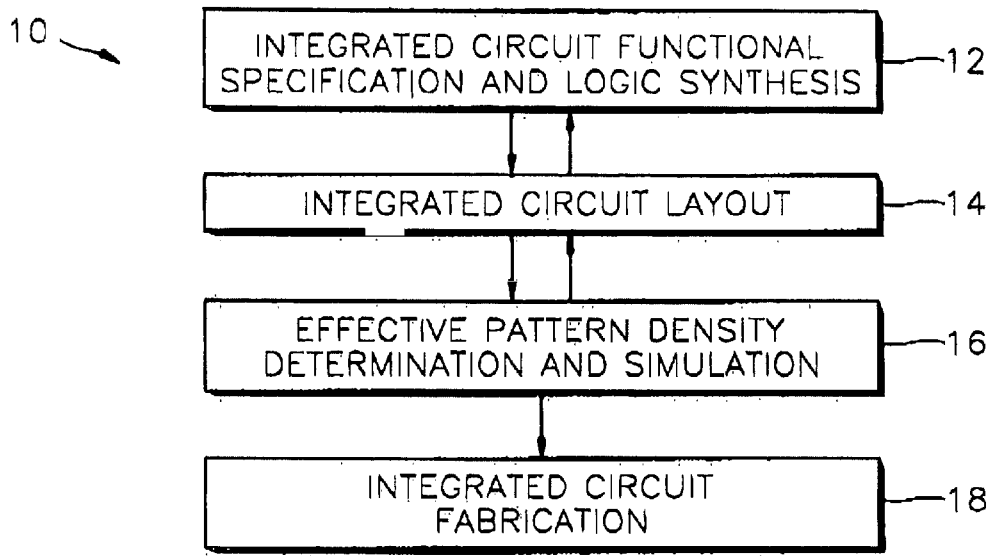
FIG. 3A is a functional block diagram of integrated circuit synthesis, layout pattern density determination and simulation and fabrication methods, systems and/or computer program products according to embodiments of the present invention.

Referring now to FIG. 3A, operations performed by embodiments of computer-aided integrated circuit synthesis, layout and manufacturing systems, methods and/or computer program products 10 will be generally described. As shown, four blocks are included: integrated circuit functional specification and logic synthesis 12, integrated circuit layout 14, effective pattern density determination and simulation 16, and integrated circuit fabrication 18.

Integrated circuit functional specification and logic synthesis Block 12 may include circuit libraries and/or macros for such elements as logic gates, flip-flops, registers, memory elements, drivers and buffers, for example. The functional specification and logic synthesis Block 12 typically provides a vehicle for generating and displaying an electrical schematic of an integrated circuit and producing a computer readable representation of the schematic as a design netlist.

A physical layout may be generated by integrated circuit layout Block 14 by placing and routing an electrical circuit schematic. A wiring program also may be provided for automatically determining the placement of the wiring interconnect nets between the active device elements of the microelectronic integrated circuit. Accordingly, the layout data that defines a patterned layer of an integrated circuit may be generated at Block 14.

Then, an effective pattern density is determined at Block 16 from the integrated circuit layout data that is produced by Block 14. A simulation of a planarization process such as chemical-mechanical polishing (CMP) then may be performed. When a final simulation of the planarization parameters is produced, integrated circuits may be fabricated using the parameters that are produced from the simulation. Integrated circuit fabrication Block 18 may generate the masks and/or may control the fabrication tools that are used to fabricate the integrated circuit on a semiconductor wafer, for example.

It will be understood by those having skill in the art that the integrated circuit functional specification and logic synthesis Block 12, integrated circuit layout Block 14, effective pattern density determination and simulation Block 16 and various parts of integrated circuit fabrication Block 18 may be realized in whole or in part as software modules running on a computer system. Alternatively, a dedicated standalone system with application specific integrated circuits for performing the above-described functions may be provided. The general design and operation of integrated circuit functional specification and logic synthesis Block 12, integrated circuit layout Block 14 and integrated circuit fabrication Block 18 are well known to those having skill in the art and need not be described further herein.

Figure 3B:
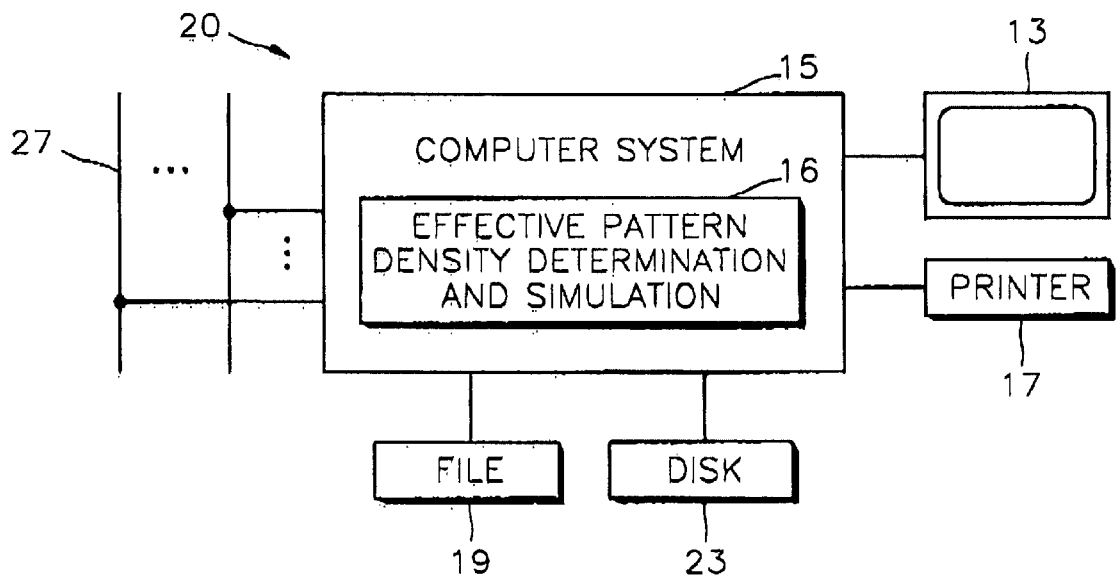
FIG. 3B is a block diagram of hardware that may used to embody the systems, methods and/or computer program products of FIG. 3A.

Referring now to FIG. 3B, a general hardware description of a computer workstation containing, among other things, the effective pattern determination and simulation Block 16 of FIG. 3A will be described. As shown in FIG. 3B, the workstation 20 preferably includes a computer 15 containing an effective pattern density determination and simulation software subsystem 16 running thereon. The effective pattern density determination and simulation subsystem 16 may accept a computer representation of the layout data via a file 19, disk input 23 and/or data bus 27. A display 13 and printer 17 preferably are provided. The hardware design of the above-described components 13, 17, 19, 27 and 23 is well known to those having skill in the art and need not be described further herein. As one example, the effective pattern density determination and simulation subsystem 16 may be run on a computer system such as a UNIX-based workstation.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer, for example through the Internet.

Figure 3C:
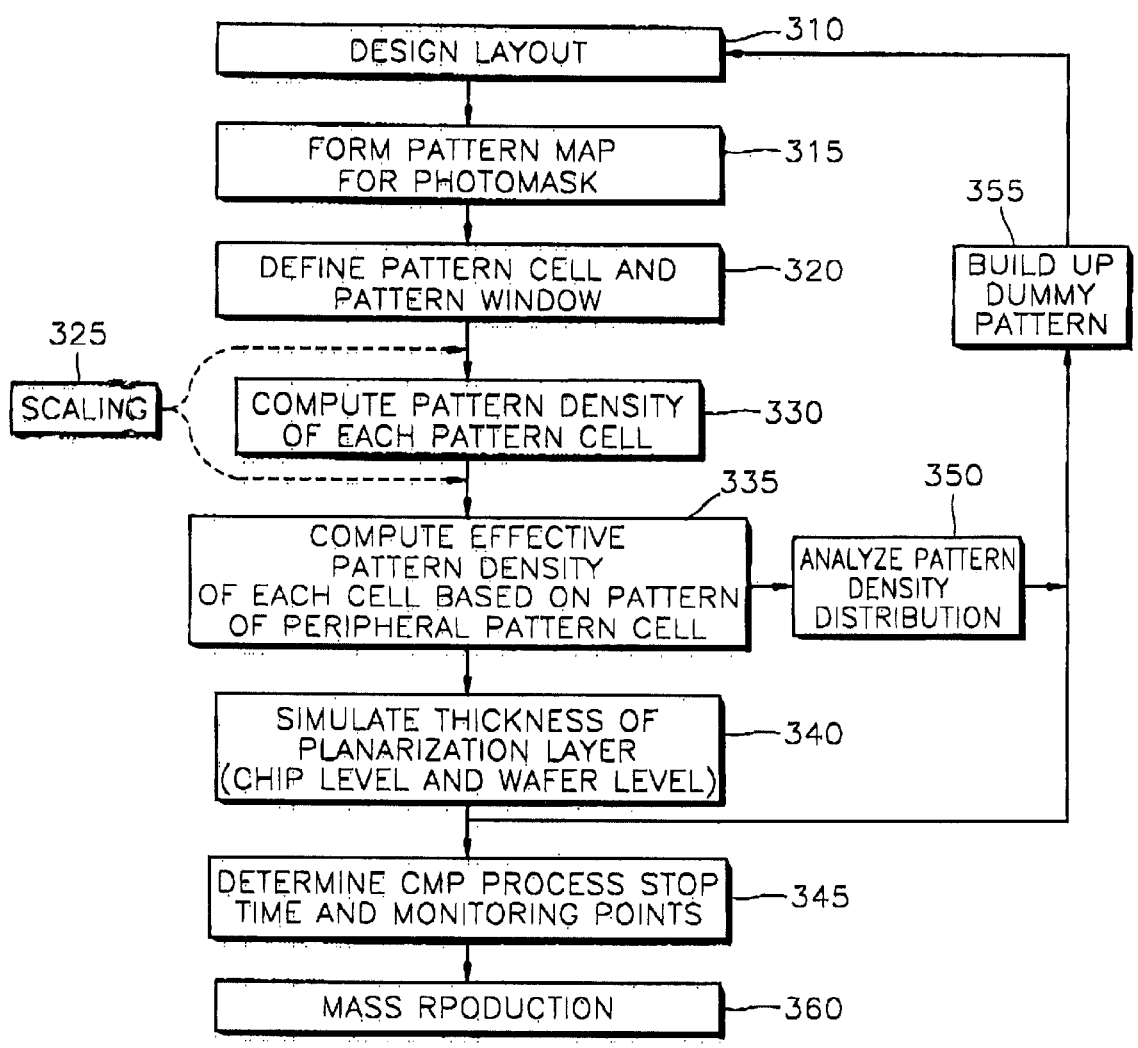
FIG. 3C is a flowchart of systems, method and/or computer program products according to other embodiments of the present invention.
Figure 4:
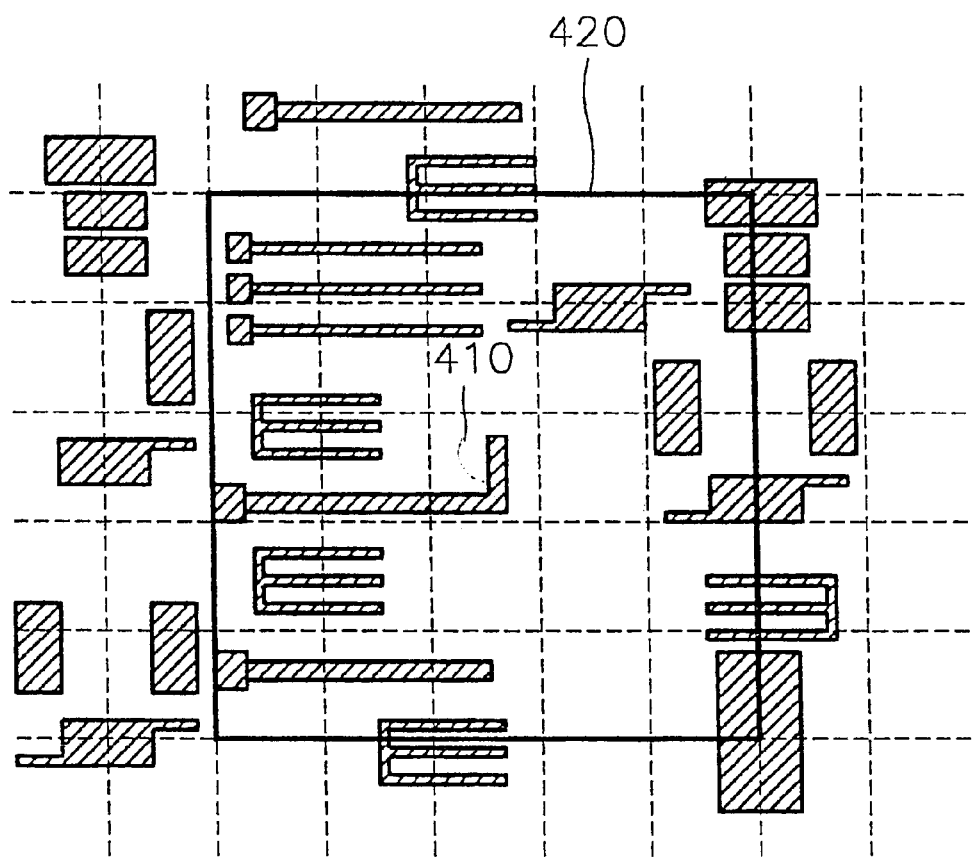
FIG. 4 is a layout of a predetermined pattern layer, illustrating defining pattern cells and pattern windows according to embodiments of the present invention.
Figure 4:

Referring now to FIG. 3C, other embodiments of systems, methods and/or computer program products for integrated circuit synthesis, layout and fabrication according to the present invention are shown. In particular, Blocks 310 to 335 illustrate a pattern density obtaining, and Block 340 to 345 illustrate a chemical-mechanical polishing (CMP) simulation according to embodiments of the present invention. With reference to FIG. 3C, a layout of one integrated circuit chip including microelectronic devices is designed (Block 310). Usually, such layout designing is carried out for each layer stacked on a wafer by means of a computer aided design (CAD) tool, resulting in a pattern map. FIG. 4 shows a part of the pattern map. The resultant pattern map is stored as numeric data with a predetermined format. The pattern map data from the layout designing may be stored with a hierarchical data structure which can decrease the amount of data to be stored and can facilitate data correction in designing.

Then, the pattern map data is used in manufacturing a photomask (reticle), which is used in a photolithography process with respect to the corresponding layer. The data structure of the pattern map data may be converted, since the hierarchical data structure of the pattern map data generally is not used in defining a region onto which electron beams are irradiated to manufacture a photomask. Thus, the hierarchical pattern map data may be converted into non-hierarchical (planar) pattern map data (Block 315). In Blocks 330 and 335, to be explained later, where the pattern density is calculated, many formats of the pattern map data can be used. However, the non-hierarchical pattern map data may be used in embodiments of the present invention due to its rapid computing speed. For example, according to the results of an experiment, it took two hours to compute the pattern density from a hierarchical pattern map data having a layout size of 6214×212 µm and five million patterns, whereas it took 139 seconds for the non-hierarchical pattern map data having a layout size of 15040×15225 µm and sixty five million patterns.

In order to compute the pattern density with respect to the pattern map, pattern cells and pattern windows are defined (Block 320). A grid 410, indicated by the dashed line in FIG. 4, defines the pattern cells, and a section of the grid 420 indicted by a solid line represents a pattern window. The pattern window 420 includes a plurality of peripheral pattern cells to be considered to calculate the effective pattern density of a pattern cell. Here, the term "effective pattern density" refers to the pattern density of a certain pattern cell based on the patterns of remote pattern cells. Patterns of adjacent cells also may be included, and preferably are included. As the size of pattern cells decreases and the number of pattern cells of the pattern window increases, accuracy in prediction can increase, although the computing time also may increase. Thus, the size and number of pattern cells to be selected preferably are determined in consideration of the pattern size and the like.

Referring to Block 330, the pattern density of each pattern cell is computed. The pattern density of all pattern cells in the pattern map may be computed by dividing the area of a pattern occupying each pattern cell by the total area of each pattern cell.

Figure 5A:
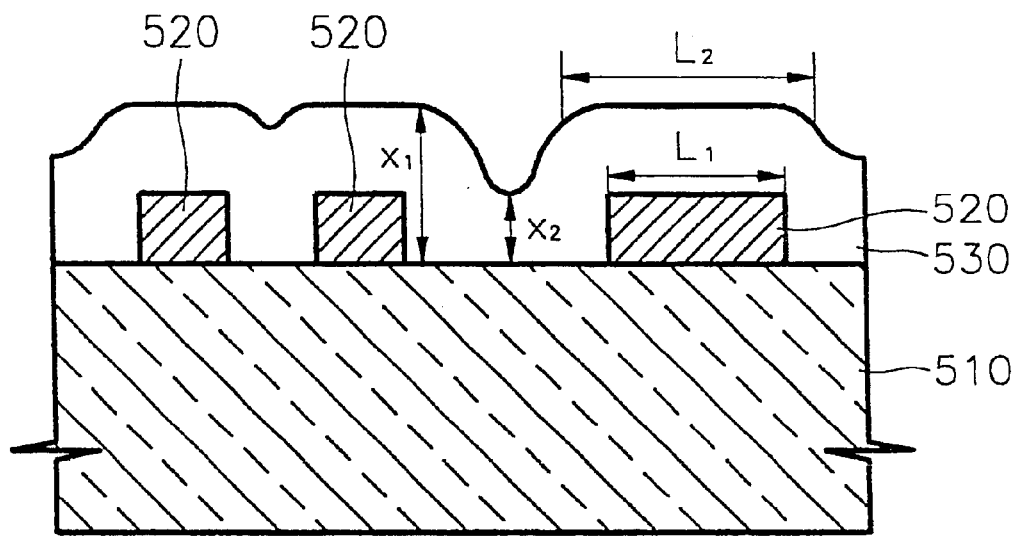
FIGS. 5A and 5B are cross-sectional views illustrating pattern density variations according to embodiments of the present invention.
Figure 5B:
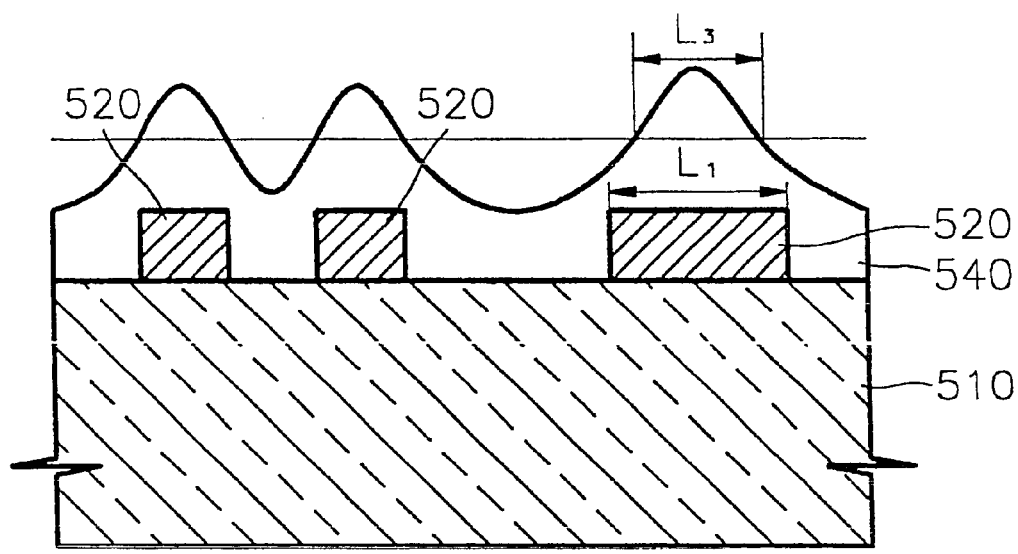

In order to allow an increase in prediction accuracy, scaling the pattern up and/or down based upon a processing method that is used to stack an upper layer (planarization layer) may be added at Block 325. For example, as shown in FIGS. 5A and 5B, the thickness and width of planarization layers 530 and 540 to be exposed to CMP, which are stacked on the same pattern 520 (corresponding to the pattern shown in FIG. 4) and are formed on the same underlayer 510, can vary according to a fabrication method used to form the planarization layers 530 and 540. The planarization layer 530 of FIG. 5A was deposited by plasma enhanced chemical vapor deposition (PECVD) and the planarization layer 540 of FIG. 5B was deposited by high density plasma deposition. As shown in FIGS. 5A and 5B, the width L2 of the planarization layer having a predetermined height, which is high enough to affect the actual CMP, is larger than the width L1 of the pattern 520, whereas the width L3 of the planarization layer having the predetermined height is smaller than the width L1 of the pattern 520. Thus, the width L1 of the pattern 520 may be uniformly enlarged or scaled up by about 75% of the thickness of the planarization layer 530 in the case of FIG. 5A, whereas the width L1 of the pattern 520 may be uniformly reduced or scaled down by 10% of the thickness of the planarization layer 540 in the case of FIG. 5B. If the width of pattern is less than zero after reduction, the width of the pattern preferably is set to be 0. Then, the pattern density of each pattern cell is computed with respect to the enlarged or reduced pattern. It will be understood that the amount of enlargement or reduction with respect to the pattern is merely illustrative, and may vary depending on various conditions of the process of stacking the planarization layer.

As described above, the scaling may be carried out prior to the computation of pattern density. However, the scaling also may be performed after the computation of pattern density of each pattern cell, by multiplying the computed pattern density by a scaling factor which has been calculated in consideration of the planarization layer fabrication method.

Referring now to Block 335, according to embodiments of the invention, the effective pattern density of each pattern cell is computed based on the pattern density from Block 330 by considering the patterns of the peripheral (remote) pattern cells. Adjacent cells also may be considered, and preferably are considered. The effective pattern density preferably reflects deformation of a polishing pad, which depends on processing conditions such as the hardness of the polishing pad and/or the downward polishing pressure of a wafer on the polishing pad. Thus, the effective pattern density can be closely associated with the result of the actual CMP.

Figure 6:
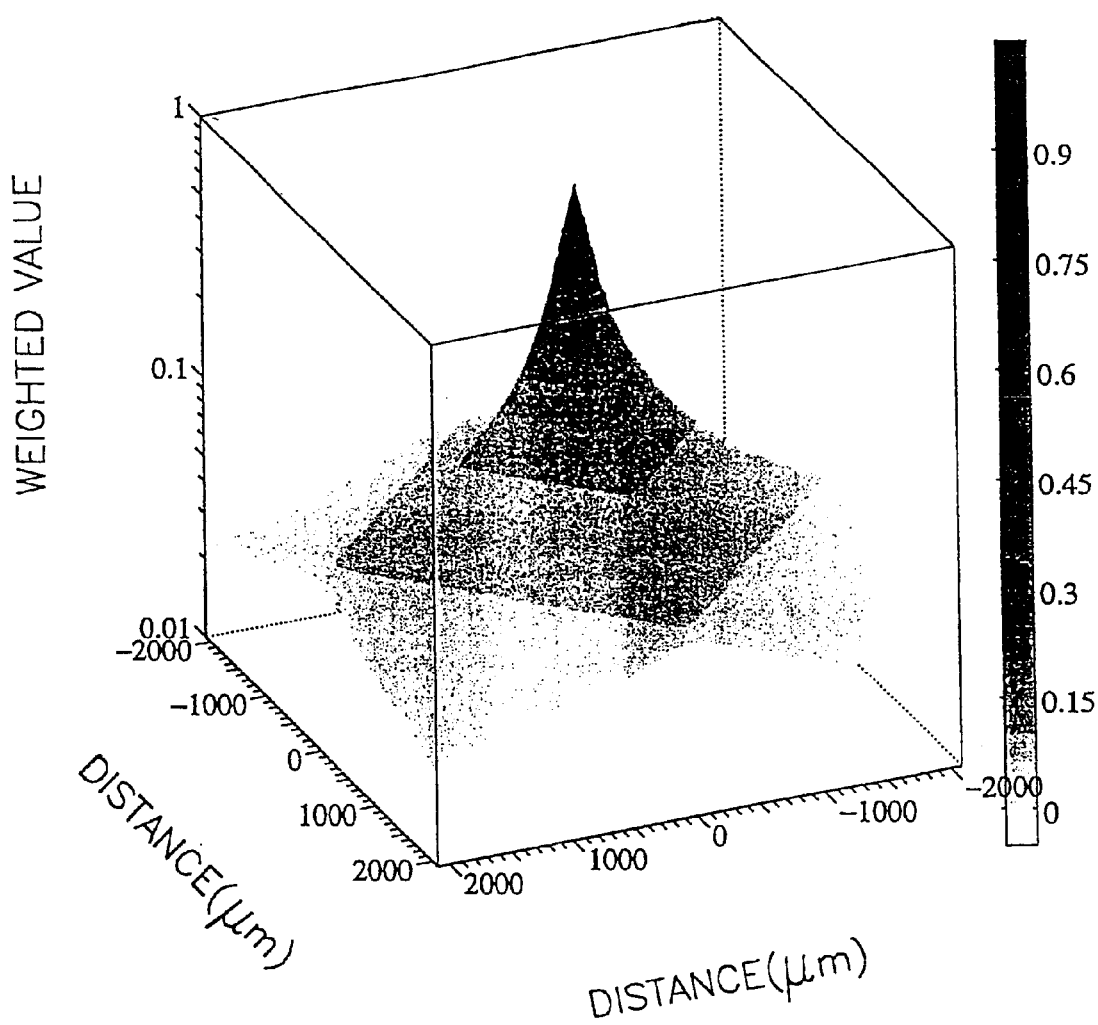
FIG. 6 is a graph of a weighted value function according to embodiments of the present invention.

According to one embodiment, assuming that the pattern density of each pattern cell is D(i,j), the effective pattern density $D_p(i,j)$ is computed by:

$$D_p(i, j) = \frac{1}{(2n+1)^2} \sum_{l=i-n}^{i+n} \sum_{m=j-n}^{j+n} \frac{D(l, m)}{|l| + |m|} D(i, j), \quad (1)$$

if $(l = i, m = j)$ then $(|l| + |m| = 1)$ where i and j represent positions in the X-axis and Y-axis, respectively, of each pattern cell in the pattern map shown in FIG. 4, n is a value which represents the number of peripheral pattern cells in the up, down, right and left directions with respect to a central pattern cell 410 in the pattern window 420 shown in FIG. 4 when a target pattern cell (i,j) is viewed as the central pattern cell 410, wherein the total number of pattern cells in the pattern window 420 is $(2n+1)^2$. Also, $$\frac{1}{|l| + |m|}$$

is a weighted value, which is used to consider the effect of the peripheral pattern cells on the target pattern cell 410, wherein the weighted value is inversely proportional to the distance from the target pattern cell 410 to the peripheral pattern cells as shown in FIG. 6. Also, the weighted value equals 1 when l=i and m=j, that is, when a peripheral pattern cell (l,m) is identical to the target pattern cell (i,j). Another weighted value that may be used is $$\frac{1}{\sqrt{l^2 + m^2}}.$$

This weighted value also equals 1 when l=1 and m=j.

According to the computation by Equation (1), in embodiments of the invention, each pattern cell is viewed as the central pattern cell 410, the pattern density of each peripheral pattern cell included in the pattern window 420 is multiplied by the weighted value, and the products and the pattern density of the central pattern cell are multiplied together. Then, the multiplied products are summed and divided by the number of pattern cells included in the pattern window. When the computation is carried out for all the pattern cells of an integrated circuit chip, the effective pattern density distribution with respect to the pattern map of an integrated circuit chip may be obtained.

Figure 7:
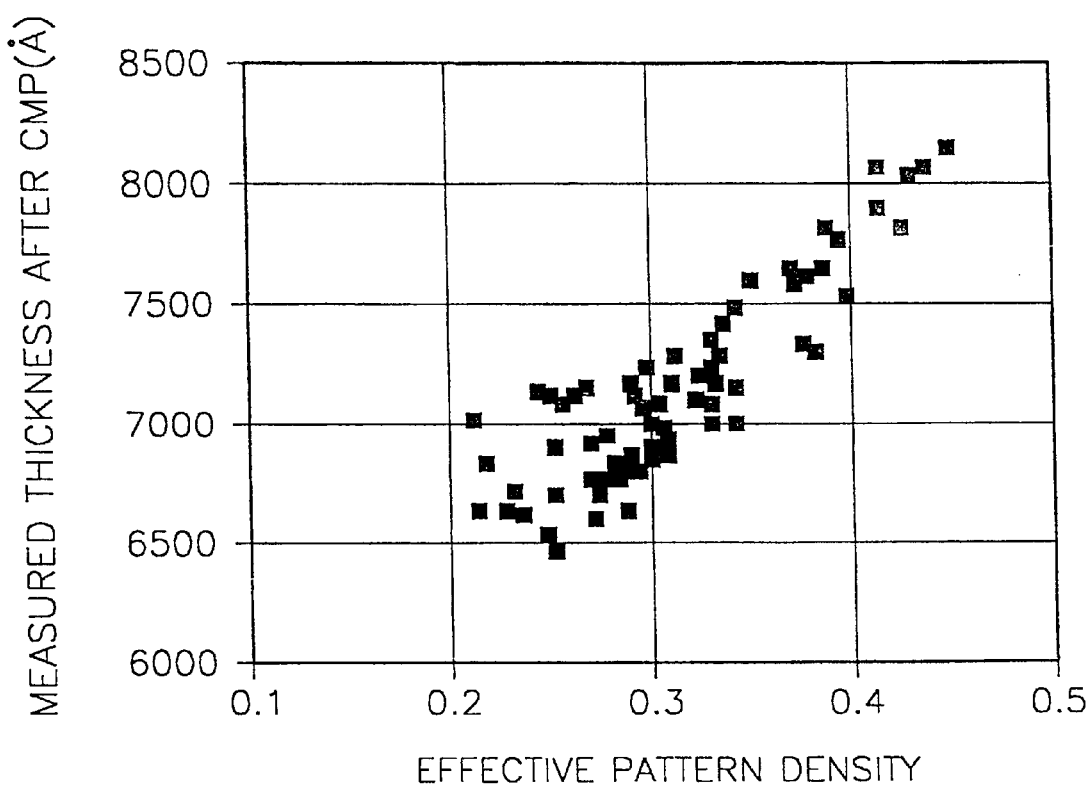
FIG. 7 is a graph of planarization layer thickness measured after CMP versus pattern density according to embodiments of the present invention.

The effective pattern density distribution is analyzed (Block 350 of FIG. 3). According to embodiments of the invention, the analysis result may be used to build up a dummy pattern, which is formed of a material layer that is the same as the actual pattern, without connection thereto so as to reduce and preferably prevent the dishing phenomenon at an area having a lower pattern density. The formation of the dummy pattern at a lower pattern density area is based on the fact that the thickness of the planarization layer after CMP generally becomes smaller at a lower pattern density area, as shown in FIG. 7, so that the dishing phenomenon may be present in the low pattern density area.

Then, Block 340 simulates the thickness of the planarization layer after CMP using the effective pattern density obtained in Block 335. Embodiments of the simulation process can include a chip (integrated circuit) level simulation where the thickness of the planarization layer is simulated in an integrated circuit chip, and/or a wafer level simulation where the thickness of the planarization layer is simulated across the entire wafer using the chip level simulation result.

First, in embodiments of the chip level simulation, the polishing rate (dx/dt) of the planarization layer at a height x is defined as follows based on the Preston equation, which is a conventional equation used in analytical CMP modeling.

$$\frac{dx}{dt} = kPV. \quad (2)$$

In Equation (2), P represents the mean pressure applied to the wafer, that is, the load per area of wafer, V represents the relative velocity of the wafer with respect to a polishing pad, and k is the Preston's coefficient, which is expressed by $k=k_p \times k_v$.

Then, assuming that the polishing pad is a spring (spring model), the following Equation (3) is obtained:

$$P_1 - P_2 = \frac{E}{U}(x_1 - x_2). \quad (3)$$

In Equation (3), E represents the Young's modulus of the polishing pad, U represents the thickness of the polishing pad, $x_1$ and $x_2$ represent the heights (see FIG. 5A) of the planarization layer at an area with and without a pattern, respectively, and $P_1$ and $P_2$ represent pressures applied to the wafer from the polishing pad at areas of the planarization layer having the heights of $x_1$ and $x_2$, respectively.

Then, the relation between mean pressure P, and pressures $P_1$ and $P_2$ may be obtained by the sum of the partial pressures $P_1$ and $P_2$ in accordance with the pattern density $D(i,j)$ and $(1-D(i,j))$, which can be expressed as:

$$D(i,j)P_1 + \{1 - D(i,j)\}P_2 = P. \quad (4)$$

Then, when solving Equations (2) through (4) for the thickness, that is, the height, of the planarization layer at a polishing time "t", the height of the planarization layer at each pattern cell H(i,j) after CMP may be obtained as follows:

$$H(i, j) = H_0(i, j) + [D(i, j)x_1 - \{1 - D(i, j)\}x_2] \quad (5)$$

$$= H_0(i, j) + X_0 - kVPt +$$

$$h_0 \left[ D(i, j) \exp\left(\frac{-kVtE}{U}\right) + D_p(i, j) \left\{ 1 - \exp\left(\frac{-kVtE}{U}\right) \right\} \right]$$

In Equation (5), $H_0$ represents an initial total height of a plurality of layers which already have been stacked, wherein in the case where the stacking of each layer and CMP are repeatedly performed, the simulation result of the preceding CMP process can be used as the initial input for simulating the CMP on the current planarization layer. Also, $X_0$ represents the thickness of the stacked planarization layer, and ho represents an initial step difference.

According to Equation (5), the amount of polishing of the planarization layer at each pattern cell after the polishing time "t" passes is proportional to the pressure P and the relative velocity V, and the step difference is proportional to the pattern density, the relative velocity V and the Young's modulus E of the polishing pad and is inversely proportional to the thickness U of the polishing pad.

According to embodiments of the invention, when the computation of the height of the planarization layer in each pattern cell after CMP has been completed across all the pattern cells, the thickness and the step difference distribution of the planarization layer after CMP over the entire chip may be obtained. Then, a CMP stop time and points at which monitoring is performed during the actual CMP can be determined using the thickness of the planarization layer and the step difference distribution (Block 345). The monitoring points refer to points, for example, during fabrication or mass production (Block 360), at which the state of CMP is observed. Usually, the monitoring points are determined to include the points having a maximum height and a minimum height of the planarization layer, which are obtained through simulation, can be monitored.

Also, according to embodiments of the invention, the thickness and the step difference distribution of the planarization layer can be used in Block 355 to build up the dummy pattern. The determination of the CMP stop time and the monitoring points, and the built-up dummy pattern may be performed after a wafer level simulation.

According to embodiments of the invention, in the wafer level simulation based on the result of the chip level simulation, the thickness and the step difference distribution of the planarization layer may be computed as follows: The result of the chip level simulation is utilized as a basic data in predicting the thickness distribution of the planarization layer over the entire wafer. However, for more accurate prediction of the thickness distribution at a wafer level, variation of each parameter in accordance with positions within the wafer may be considered. In one embodiment, the variation of each parameter is calculated using an equation and/or is measured from the results of actual CMP on a bare wafer.

In embodiments that use an equation to calculate the variation of each parameter, the relative velocity of the wafer with respect to the polishing pad, and the downward polishing pressure of a wafer on the polishing pad, which can vary according to the position of each pattern cell within the wafer, may be considered as the most variable parameters. In detail, the relative velocity of the wafer with respect to the polishing pad may be calculated by:

$$V(R_c) = \int_0^T \frac{\vec{V}(R_c, t) dt}{T} \quad (6)$$

$$= \frac{2\pi L \Omega_p}{60} \int_0^1 \left\{ \left(1 - \frac{\Omega_c}{\Omega_p}\right)^2 \left(\frac{R_c}{L}\right)^2 + 2\left(1 - \frac{\Omega_c}{\Omega_p}\right)\left(\frac{R_c}{L}\right)\cos(2\pi t + 1) \right\}^{1/2} dt,$$

where $R_c$ represents the distance from the axis 130 of rotation (see FIG. 1) of the polishing pad 110 to each pattern cell of the wafer 140, L represents the distance between the rotary axis 130 of the polishing pad 110 and the axis 160 of rotation of the wafer 140, and $\Omega_p$ and $\Omega_c$ represent the rotational velocity of the polishing pad 110 and the wafer 140, respectively.

Also, the pressure P at each pattern cell in the wafer may be calculated by:

$$P(r_w) = a\left\{P_1 - (P_1 - P_0)\left(\frac{r_w}{R}\right)^2\right\}, \quad (7)$$

where $r_w$ represents the distance from the center of the wafer 140 to each pattern cell, $P_1$ represents the pressure at the center of the wafer, $P_0$ represents the pressure at the edge of the wafer, and R represents the radius of the wafer. Equations (6) and (7) are substituted into Equation (5) and if Equation (5) is solved, the height of the planarization layer of each pattern cell after CMP may be obtained with respect to its position in the wafer.

In other embodiments, to measure the parameters through the actual CMP on a bare wafer, the bare wafer is mounted onto a CMP apparatus and then CMP is performed on the bare wafer to measure the parameters. Then, the measured parameters are substituted into Equation (5) and Equation (5) is solved. The embodiments of measuring the parameters can provide more accurate simulation results where variations of parameters other than those of the relative velocity V and the pressure P can greatly influence the CMP.

The CMP stop time and the monitoring points can be determined (Block 345) based on the thickness and the step difference distribution of the planarization layer at a wafer level. Additionally, the thickness and the step difference distribution of the planarization layer can be used to build up the dummy pattern (Block 355), and the resultant structure can be fed back to the design layout Block 310.

EXAMPLE

The following example is illustrative and should not be viewed as limiting the present invention. In order to investigate how the chip level simulation result can closely coincide with the thickness and the step difference distribution of the planarization layer, which are measured through actual CMP, CMP was performed on a sample, and the result was compared to the simulation result.

In the preparation of the sample, a metal pattern layer having mean pattern density of 0.29 and having an initial step difference $h_0$ of 8000 Å, was formed on a wafer having integrated circuit chips of a size of 2×2 cm, and then an interlayer dielectric (ILD) layer (planarization layer) made of a silicon oxide layer was deposited thereon to a thickness ($X_0$) of 21,000 Å. The main parameters of the CMP process were determined as follows: the pressure P was set to 8.5 lb/inch$^2$, the rotational velocity of the polishing pad was set to 35 rpm, the rotational velocity of the wafer was set to 15 rpm, and the polishing time "t" was set to 2 minutes and 50 seconds. For simulation, the pattern map of the sample was divided into 39,798 (201×198) pattern cells each having a size of 99.5×99.5 µm, and the above parameters were substituted into the above equations and then solved. The size of a pattern window was determined to include 45×45 pattern cells, that is, n of Equation (1) was set to 22. The maximum and minimum heights of the planarization layer, which were obtained by simulation, were 7960 Å and 5670 Å, respectively.

To compare the simulation result to the result of the actual CMP, the thickness of the planarization layer of the sample was measured at 82 pattern cells, and the measured results were compared to the simulation results at the same pattern cells. The results are graphed in FIGS. 8A and 8B.

Figure 8A:
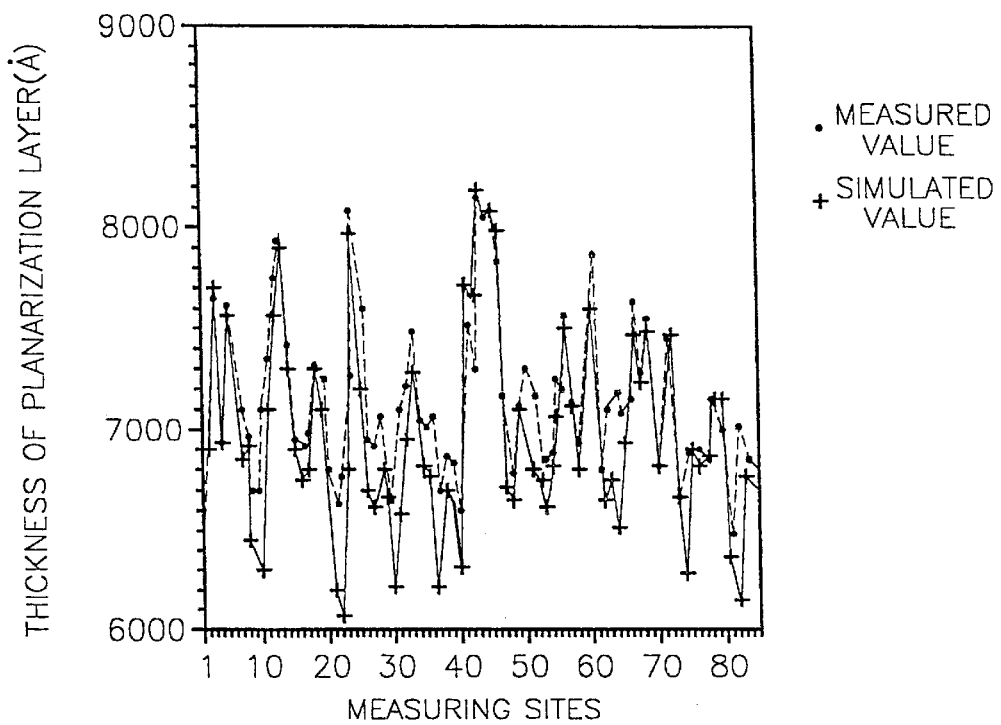
FIGS. 8A and 8B are graphs comparatively showing the thickness of a planarization layer at a chip level, which is computed by an embodiment of the present invention and is measured after the actual CMP.
Figure 8B:
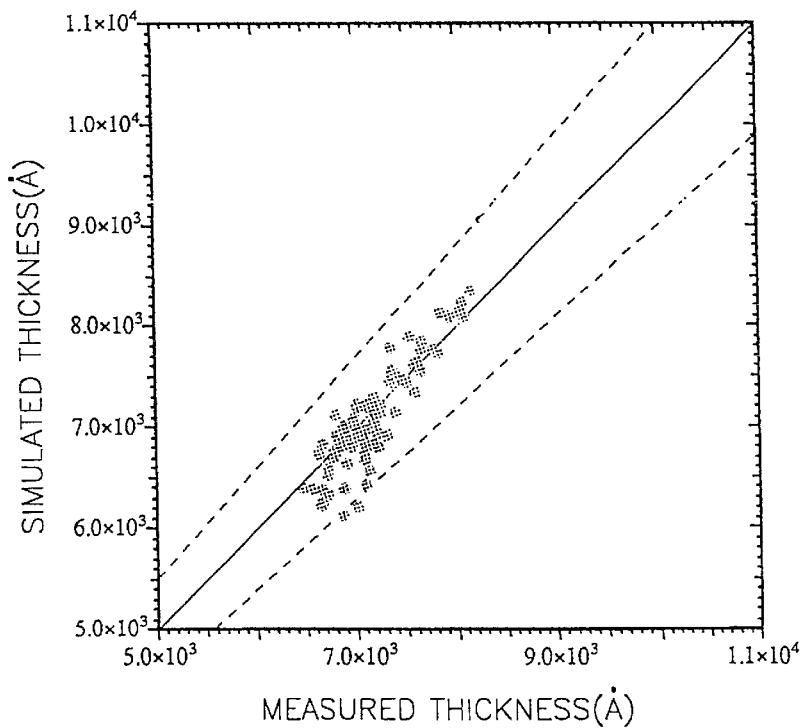

FIG. 8A shows that the simulation results at each pattern cell vary with the same trend as that of the measured results obtained after performing CMP. FIG. 8B is a correlation plot between the simulation results and the measured results. As shown in FIG. 8B, the results are distributed near the diagonal line (correlation coefficient=1) within an error range of ±10% (indicated by dashed lines), which means that the simulation results coincide well with the measured results. The mean error was 3% and the maximum error was 10%.

Then, the simulation and measurements were extended to a wafer level. As shown in the pattern map of FIG. 9A, a wafer was prepared, having 30 integrated circuit chips (each square of FIG. 9A) each having a silicon oxide layer on the same metal pattern layer as a planarization layer. The metal layer, which was deposited to form the metal pattern layer, but unpatterned, and the planarization layer deposited on the metal layer, which is the same as that formed in the wafer, remained at the periphery of the wafer where the chips are not formed. Thus, the pattern density of the periphery of the wafer was 1 and the average height thereof was greater than that of the chip area. The CMP was performed on the wafer for 2 minutes and 50 seconds.

For the simulation, a chip 2 located at the center of the wafer was chosen, and the thickness and the step difference distribution of the planarization layer at a chip level were computed as described above, and the thicknesses of the planarization layer of the remaining chips were computed based on the results from the chip 2. In order to extend the simulation to a wafer level, the parameters of Equation (5) were corrected only in consideration of the boundary conditions, that is, whether the pattern cell was located at the boundary of a wafer, rather than considering the individual distances of each pattern cell from the center of the wafer, which can reduce the amount of computation. That is, a wafer level simulation was performed considering only a variation of pattern density in the chip area with respect to the wafer peripheral area having the pattern density of 1, where a chip was not formed. According to results of the simulation, as shown in FIG. 9B, which illustrates the height of the planarization layer at the chips 2 through 6, the height of the planarization layer was the greatest at the edge of the chips 3, 4 and 6 (indicated by "E" in FIG. 9B). This result appears to be due to the step difference of the wafer periphery area in which there are no chips, with respect to the chip area.

Figure 9A:
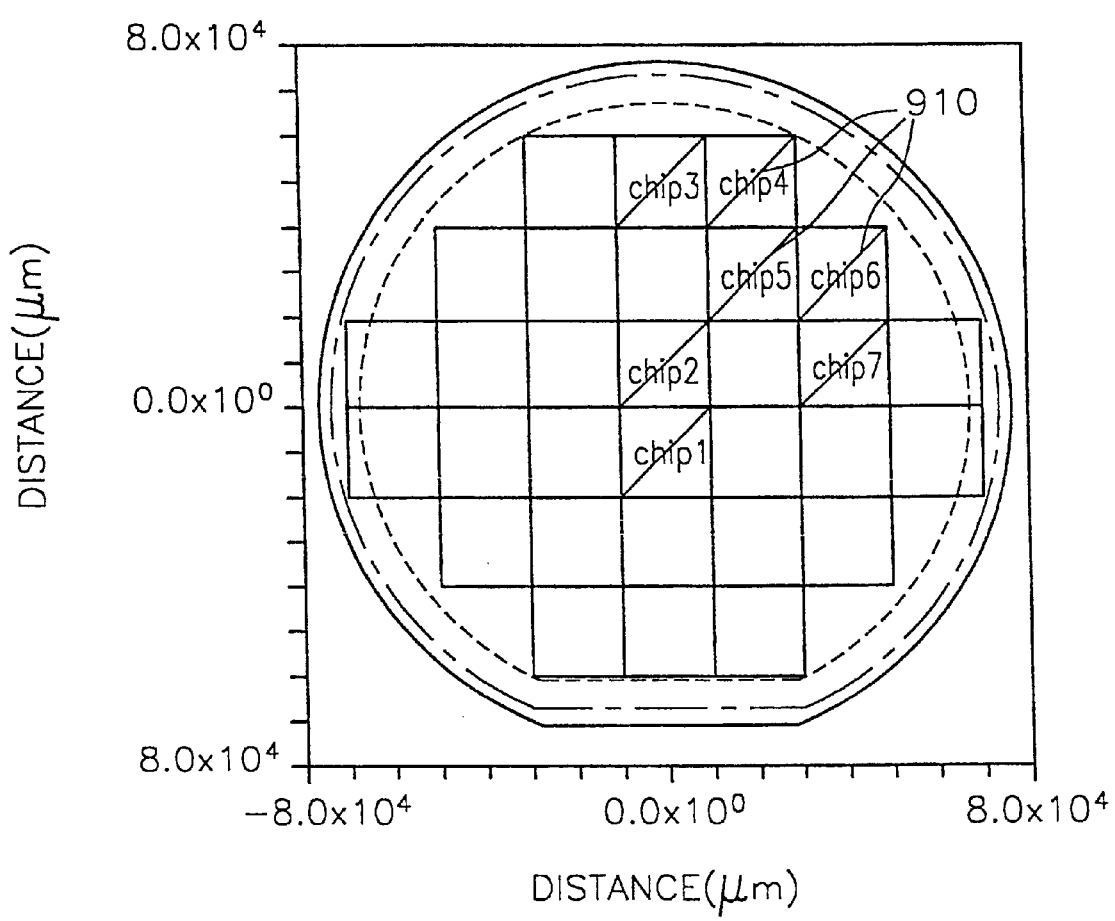
FIG. 9A is a wafer map illustrating selection of integrated circuit chips for applying a simulation at a wafer level according to embodiments of the present invention.
Figure 9C:
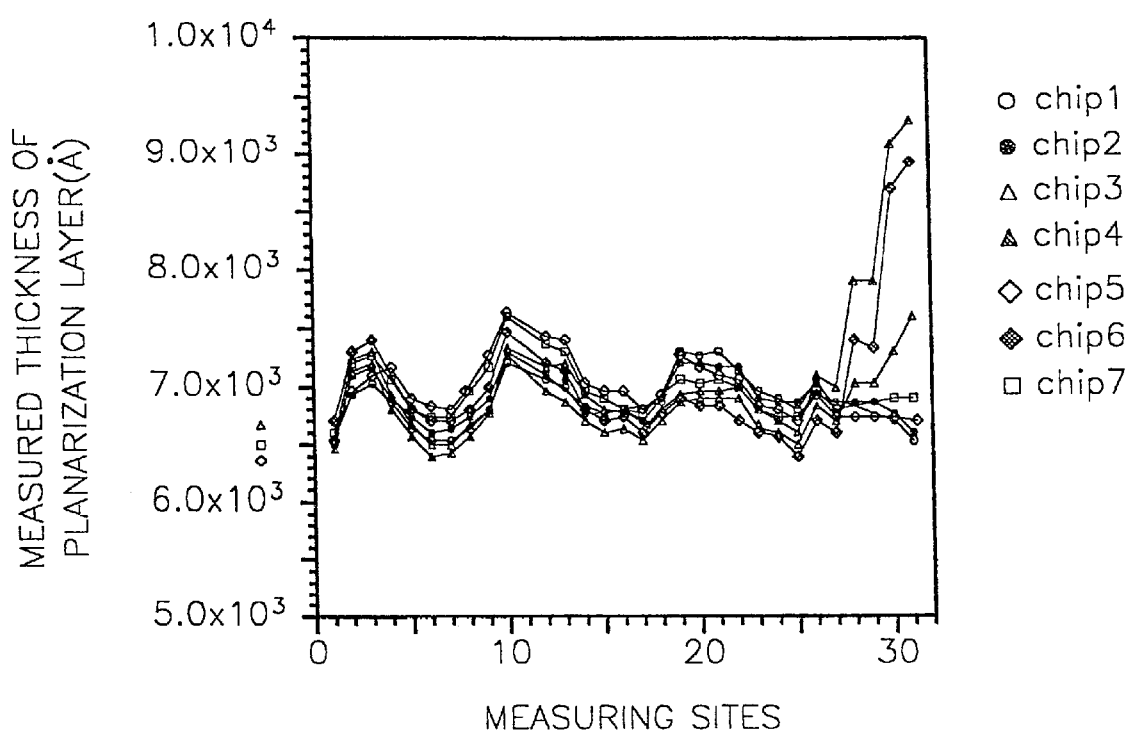
FIG. 9C is a graph showing the planarization layer thickness measured after CMP is performed at a wafer level.

In the wafer level measurement, after the actual CMP, the height of the planarization layer was measured at 31 sites along a diagonal line 910 of each of the seven chips (chips 1 through 7) shown in FIG. 9A. The result is shown in FIG. 9C. As shown in FIG. 9C, the measured height of the planarization layer was large at the edge of the chips 3, 4 and 6 (for example, at the measuring sites 31, 30 and 29), which is the same as the simulation result. Also, the simulated width, about 2.2 mm, of a region where the planarization layer was relatively thick because it was polished less due to the effects of the peripheral area of the wafer, was nearly equal to the measured width of 2.1 mm.

Figure 9D:
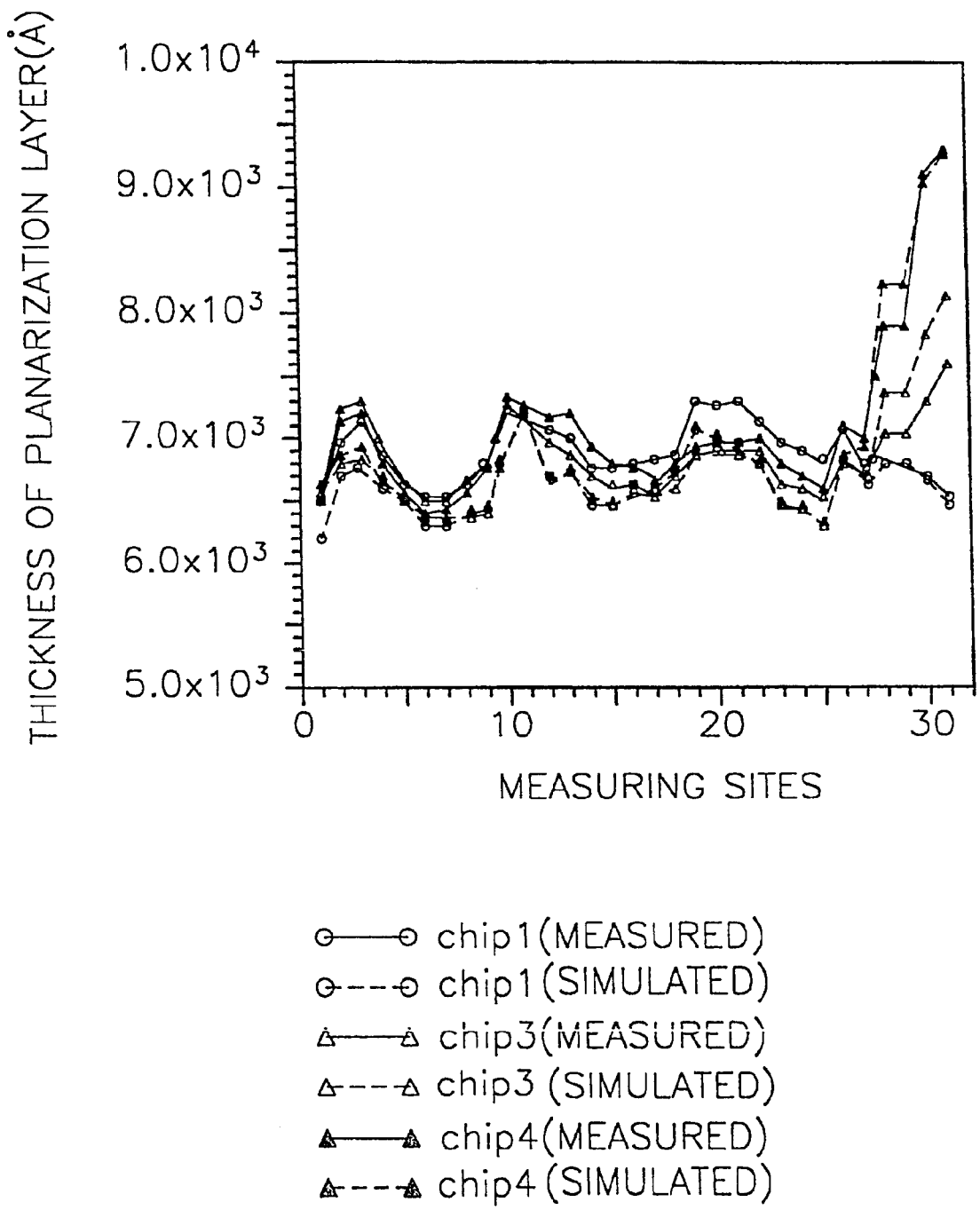
FIGS. 9D and 9E are graphs comparatively showing the thickness of a planarization layer at a wafer level, which is computed by an embodiment of the present invention and is measured after the actual CMP.
Figure 9E:
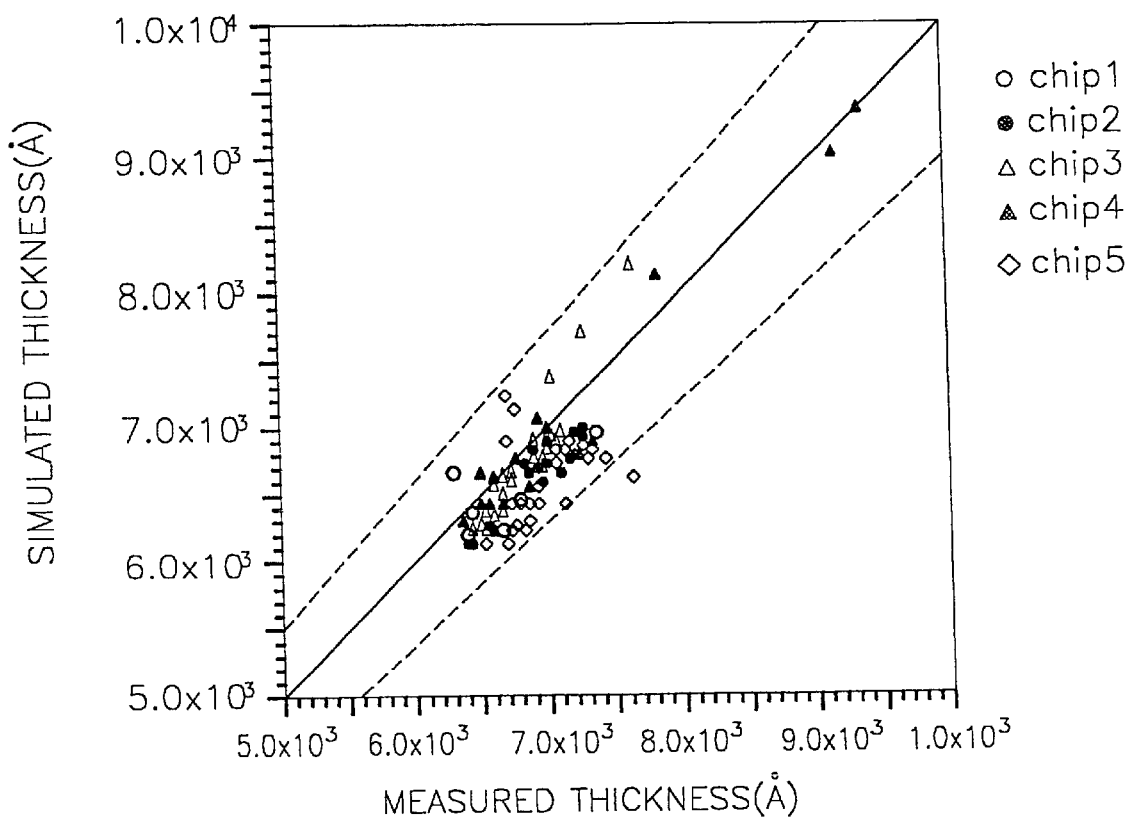

For a more distinct comparison between the results of simulation and measurement, the results of the measurement were compared to the simulation results with respect to the same sites. The comparison result is shown in FIG. 9D. As shown in FIG. 9D, the results of the wafer level simulation coincide well with the results of measurement, which was carried out following the actual CMP. The mean error of the simulation values with respect to the measured values was 4%, and the maximum error was 11%, which show a good simulation result. Also, as shown in a correlation plot of FIG. 9E between the results of simulation and measurement, the results of simulation and measurement are distributed near the diagonal line (correlation coefficient =1) within an error range of ±10% (indicated by dashed lines), which means that the simulation results correspond well to those of measurement.

In the present example of wafer level simulation, accurate simulation results can be obtained even though only the boundary conditions defined by the peripheral area of the wafer are considered under the assumption that the polishing rate is the same across the entire wafer. However, if there are further considerations about variations of the relative velocity of the wafer with respect to the polishing pad, of the pressure applied to the wafer in accordance with a distance of each pattern cell from the center of the wafer, and in accordance with a distance of each pattern cell from the axis of rotation of the polishing pad, even more accurate simulation results may be obtained.

In the above embodiments and experimental example, CMP was performed on the planarization layer, which was formed on a metal pattern layer for metal interconnection as an InterLayer Dielectric (ILD) layer. However, the present invention is not limited to the above embodiments. For example, simulation according to the present invention can be applied to other patterned layers including a Damascene process in which an ILD layer is patterned to form a region for metal interconnection, a metal layer is stacked thereon, and CMP is performed on the resultant structure to remove the metal layer stacked on the ILD layer, resulting in a metal wire. Other layers and fabrication processes also may be simulated.

CMP simulation according to embodiments of the present invention may be embodied in a general purpose digital computer by running a program from a computer usable medium, including but not limited to storage media such as magnetic storage media (e.g., ROM's, floppy disks, hard disks, etc.), optically readable media (e.g., CD-ROMs, DVDs, etc.) and carrier waves (e.g., transmissions over the Internet). Hence, the present invention may be embodied as a computer usable medium having a computer readable program embodied therein for CMP simulation, the computer readable program in the computer usable medium comprising: computer readable program code that causes a computer to effect defining pattern cells with respect to layout data of a predetermined material layer pattern; computer readable program code that causes a computer to effect computing the pattern density with respect to each pattern cell; computer readable program code that causes a computer to effect calculating the pattern density with respect to each pattern cell, in consideration of the effects of the patterns of each of the peripheral pattern cells of a selected pattern cell on the pattern density of the selected pattern cell, for each of the pattern cells; and computer readable program code that causes a computer to effect computing the thickness and the step difference distribution of a planarization layer stacked on the material layer with polishing time, using the effective pattern density of each pattern cell, for instance. A functional program, code and code segments, used to implement each program module of the present invention, can be derived by a skilled computer programmer from the description of the invention contained herein.

Embodiments of the present invention can predict the pattern density of a material layer pattern and the thickness distribution of a planarization layer after CMP with accuracy, without the need to form the actual material layer pattern or to perform the actual CMP. Thus, the designing time and cost of integrated circuit devices can be saved by utilizing the results of the simulation in optimizing layout, determining the monitoring points and the like. Also, the effects of the peripheral pattern on the pattern density of each pattern cell can be considered in accordance with distance, which can result in a more accurate simulation result. Also, in computing the pattern density, a scaling factor in accordance with a process of fabricating the planarization layer also may be considered, thereby allowing further increase in accuracy in prediction.

In addition, the chip level simulation according to embodiments of the present invention can be extended to a wafer level simulation in consideration of a variation of process parameters in accordance with the position of each pattern cell, and thus accuracy in prediction also can be increased at a wafer level.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of obtaining an effective pattern density of a patterned layer in an integrated circuit from layout data that defines the layer, the method comprising:

defining a grid of pattern cells for the layout data;

determining a respective pattern density for a respective pattern cell in the grid; and calculating an effective pattern density for a first pattern cell in the grid that is a function of the pattern density of at least a second pattern cell in the grid that is remote from the first pattern cell, and a distance of the at least a second pattern cell from the first pattern cell.

2. A method according to claim 1 wherein the calculating step comprises calculating a weighted average pattern density of a plurality of pattern cells in the grid around the first pattern cell, including pattern cells that are adjacent the first pattern cell and including the second pattern cell, that is inversely weighted as a function of the respective distances of the plurality of pattern cells from the first pattern cell.

3. A method according to claim 1 wherein the calculating step comprises:

selecting a plurality of pattern cells around the first pattern cell, the plurality of pattern cells including the second pattern cell;

multiplying the respective pattern densities of the respective plurality of pattern cells by a weighted value that is inversely proportional to respective distances of the plurality of pattern cells from the first pattern cell and by the pattern density of the first pattern cell to obtain a respective weighted pattern density for a respective one of the plurality of pattern cells; and summing the respective weighted pattern densities and dividing by a number of cells in the selected plurality of pattern cells to obtain the effective pattern density of the first pattern cell.

4. A method according to claim 1 wherein the step of determining comprises determining a scaled respective pattern density for a respective pattern cell in the grid that is scaled as a function of fabrication processes that are used to fabricate the integrated circuit.

5. A method according to claim 4 wherein the step of determining a scaled respective pattern density comprises changing a pattern width of a respective pattern cell in the grid as a function of fabrication processes that are used to fabricate the integrated circuit.

6. A method according to claim 4 wherein the step of determining a scaled respective pattern density comprises multiplying the respective pattern density for a respective pattern cell in the grid by a scaling factor that is a function of fabrication processes that are used to fabricate the integrated circuit.

7. A method according to claim 1 wherein the layer is a patterned layer upon which a planarization layer is formed and planarized using Chemical-Mechanical Polishing (CMP), and wherein the calculating step is followed by:

determining a thickness of the planarization layer as a function of CMP polishing time, based on the effective pattern density.

8. A method according to claim 7 wherein the step of determining a thickness comprises determining a thickness H of the planarization layer as a function of CMP polishing time t according to the following formula:

$$H(i,j) = H_0(i,j) + X_0 - kVPt + h_0\left[D(i,j)\exp\left(\frac{-kVtE}{U}\right) + D_p(i,j)\left\{1 - \exp\left(\frac{-kVtE}{U}\right)\right\}\right]$$

where i and j are integers which represent a position of each pattern cell in an x-axis direction and a y-axis direction, respectively, in an integrated circuit, $H_0$ represents an initial total height beneath the planarization layer, $X_0$ represents the thickness of the planarization layer, $h_0$ represents an initial step difference, D represents the pattern density of each pattern cell, $D_p$ represents the effective pattern density of each pattern cell, k represents the Preston coefficient, V represents the relative velocity of a wafer in which the integrated circuit is located with respect to a polishing pad, P represents a polishing pressure of the wafer on the polishing pad, t presents a polishing time, E represents the Young's Modulus of the polishing pad, and U represents the thickness of the polishing pad.

9. A method according to claim 8 wherein the integrated circuit is fabricated in a wafer along with other integrated circuits, wherein at least one of the parameters of the formula vary as a function of location of the integrated circuit in the wafer and wherein the step of determining a thickness is preceded by the step of:

determining the at least one of the parameters as a function of the location of the integrated circuit in the wafer.

10. A method according to claim 9 wherein the at least one of the parameters of the formula that vary as a function of location of the integrated circuit in the wafer comprise parameters V and P, and wherein the step of determining at least one of the parameters comprises the step of calculating the parameters V and P by the following second formula:

$$V(R_c) = \int_O^T \frac{\vec{V}(R_c, t)dt}{T}$$

$$= \frac{2\pi L\Omega_p}{60}\int_0^1\left\{\left(1 - \frac{\Omega_c}{\Omega_p}\right)^2\left(\frac{R_c}{L}\right)^2 + 2\left(1 - \frac{\Omega_c}{\Omega_p}\right)\left(\frac{R_c}{L}\right)\cos(2\pi t + 1)\right\}^{1/2}dt$$

and $P(r_w) = a\left\{P_1 - (P_1 - P_0)\left(\frac{r_w}{R}\right)^2\right\}$ respectively, where $R_c$ represents a distance from an axis of rotation of the polishing pad to each pattern cell of the wafer, L represents a distance between the axis of rotation of the polishing pad and an axis of rotation of the wafer, $\Omega_p$ represents a rotational velocity of the polishing pad, $\Omega_c$ represents a rotational velocity of the wafer, t represents a polishing time, $r_w$ represents a distance from the center of the wafer to each pattern cell, $P_1$ represents a pressure at the center of the wafer, $P_0$ represents a pressure at the edge of the wafer, and R represents a radius of the wafer.

11. A method according to claim 9 wherein the parameters that vary as a function of location of the integrated circuit in the wafer are obtained from measurements that are carried out after performing chemical-mechanical polishing on a bare wafer.

12. A method according to claim 1 wherein the following step is performed after the step of calculating:

determining a stop time for chemical mechanical polishing a layer on the patterned layer, based upon the effective pattern density.

13. A method according to claim 1 wherein the following step is performed after the step of calculating:

determining monitoring points for chemical mechanical polishing a layer on the patterned layer, based upon the effective pattern density.

14. A method according to claim 1 wherein the following steps are performed after the step of calculating:

determining a portion of a layer on the patterned layer that will thin during chemical mechanical polishing the layer, based upon the effective pattern density;

adding a dummy pattern to a corresponding portion of the patterned layer; and wherein the defining step is responsive to the layout data and to the dummy pattern.

15. A system for obtaining an effective pattern density of a patterned layer in an integrated circuit from layout data that defines the layer, the method comprising:

means for defining a grid of pattern cells for the layout data;

means for determining a respective pattern density for a respective pattern cell in the grid; and means for calculating an effective pattern density for a first pattern cell in the grid that is a function of the pattern density of at least a second pattern cell in the grid that is remote from the first pattern cell, and a distance of the at least a second pattern cell from the first pattern cell.

16. A system according to claim 15 wherein the means for calculating comprises means for calculating a weighted average pattern density of a plurality of pattern cells in the grid around the first pattern cell, including pattern cells that are adjacent the first pattern cell and including the second pattern cell, that is inversely weighted as a function of the respective distances of the plurality of pattern cells from the first pattern cell.

17. A system according to claim 15 wherein the means for calculating comprises:

means for selecting a plurality of pattern cells around the first pattern cell, the plurality of pattern cells including the second pattern cell;

means for multiplying the respective pattern densities of the respective plurality of pattern cells by a weighted value that is inversely proportional to respective distances of the plurality of pattern cells from the first pattern cell and by the pattern density of the first pattern cell to obtain a respective weighted pattern density for a respective one of the plurality of pattern cells; and means for summing the respective weighted pattern densities and dividing by a number of cells in the selected plurality of pattern cells to obtain the effective pattern density of the first pattern cell.

18. A system according to claim 15 wherein the means for determining comprises means for determining a scaled respective pattern density for a respective pattern cell in the grid that is scaled as a function of fabrication processes that are used to fabricate the integrated circuit.

19. A system according to claim 18 wherein the means for determining a scaled respective pattern density comprises means for changing a pattern width of a respective pattern cell in the grid as a function of fabrication processes that are used to fabricate the integrated circuit.

20. A system according to claim 18 wherein the means for determining a scaled respective pattern density comprises means for multiplying the respective pattern density for a respective pattern cell in the grid by a scaling factor that is a function of fabrication processes that are used to fabricate the integrated circuit.

21. A system according to claim 15 wherein the layer is a patterned layer upon which a planarization layer is formed and planarized using Chemical-Mechanical Polishing (CMP), the system further comprising:

means for determining a thickness of the planarization layer as a function of CMP polishing time, based on the effective pattern density, in response to the means for calculating.

22. A system according to claim 21 wherein the means for determining a thickness comprises means for determining a thickness H of the planarization layer as a function of CMP polishing time t according to the following formula:

$$H(i, j) = H_0(i, j) + X_0 - kVPt + h_0\left[D(i, j)\exp\left(\frac{-kVtE}{U}\right) + D_p(i, j)\left\{1 - \exp\left(\frac{-kVtE}{U}\right)\right\}\right]$$

where i and j are integers which represent a position of each pattern cell in an x-axis direction and a y-axis direction, respectively, in an integrated circuit, $H_0$ represents an initial total height beneath the planarization layer, $X_0$ represents the thickness of the planarization layer, $h_0$ represents an initial step difference, D represents the pattern density of each pattern cell, $D_p$ represents the effective pattern density of each pattern cell, k represents the Preston coefficient, V represents the relative velocity of a wafer in which the integrated circuit is located with respect to a polishing pad, P represents a polishing pressure of the wafer on the polishing pad, t presents a polishing time, E represents the Young's Modulus of the polishing pad, and U represents the thickness of the polishing pad.

23. A system according to claim 22 wherein the integrated circuit is fabricated in a wafer along with other integrated circuits, wherein at least one of the parameters of the formula vary as a function of location of the integrated circuit in the wafer and wherein the system further comprises:

means for determining the at least one of the parameters as a function of the location of the integrated circuit in the wafer, the means for determining a thickness being responsive to the means for determining at least one of the parameters.

24. A system according to claim 23 wherein the at least one of the parameters of the formula that vary as a function of location of the integrated circuit in the wafer comprise parameters V and P, and wherein the means for determining at least one of the parameters comprises means for calculating parameters V and P by the following second formula:

$$V(R_c) = \int_O^T \frac{\vec{V}(R_c, t)dt}{T}$$

$$= \frac{2\pi L \Omega_p}{60} \int_0^1 \left\{\left(1 - \frac{\Omega_c}{\Omega_p}\right)^2 \left(\frac{R_c}{L}\right)^2 + 2\left(1 - \frac{\Omega_c}{\Omega_p}\right)\left(\frac{R_c}{L}\right)\cos(2\pi t + 1)\right\}^{1/2} dt$$

and $P(r_w) = a\left\{P_1 - (P_1 - P_0)\left(\frac{r_w}{R}\right)^2\right\}$ respectively, where $R_c$ represents a distance from an axis of rotation of the polishing pad to each pattern cell of the wafer, L represents a distance between the axis of rotation of the polishing pad and an axis of rotation of the wafer, $\Omega_p$ represents a rotational velocity of the polishing pad, $\Omega_c$ represents a rotational velocity of the wafer, t represents a polishing time, $r_w$ represents a distance from the center of the wafer to each pattern cell, $P_i$ represents a pressure at the center of the wafer, $P_0$ represents a pressure at the edge of the wafer, and R represents a radius of the wafer.

25. A system according to claim 23 wherein the parameters that vary as a function of location of the integrated circuit in the wafer are obtained from measurements that are carried out after performing chemical-mechanical polishing on a bare wafer.

26. A system according to claim 15 further comprising:
means for determining a stop time for chemical mechanical polishing a layer on the patterned layer, based upon the effective pattern density.

27. A system according to claim 15 further comprising:
means for determining monitoring points for chemical mechanical polishing a layer on the patterned layer, based upon the effective pattern density.

28. A system according to claim 15 further comprising:
means for determining a portion of a layer on the patterned layer that will thin during chemical mechanical polishing the layer, based upon the effective pattern density;
means for adding a dummy pattern to a corresponding portion of the patterned layer; and
wherein the means for defining is responsive to the layout data and to the dummy pattern.

29. A computer program product that obtains an effective pattern density of a patterned layer in an integrated circuit from layout data that defines the layer, the computer program product comprising a computer usable storage medium having computer readable program code embodied in the medium, the computer readable program code comprising:
computer readable program code that defines a grid of pattern cells for the layout data;
computer readable program code that determines a respective pattern density for a respective pattern cell in the grid; and
computer readable program code that calculates an effective pattern density for a first pattern cell in the grid that is a function of the pattern density of at least a second pattern cell in the grid that is remote from the first pattern cell, and a distance of the at least a second pattern cell from the first pattern cell.

30. A computer program product according to claim 29 wherein the computer readable program code that calculates comprises computer readable program code that calculates a weighted average pattern density of a plurality of pattern cells in the grid around the first pattern cell, including pattern cells that are adjacent the first pattern cell and including the second pattern cell, that is inversely weighted as a function of the respective distances of the plurality of pattern cells from the first pattern cell.

31. A computer program product according to claim 29 wherein the computer readable program code that calculates comprises:
computer readable program code that selects a plurality of pattern cells around the first cell, the plurality of pattern cells including the second pattern cell;
computer readable program code that multiplies the respective pattern densities of the respective plurality of pattern cells by a weighted value that is inversely proportional to respective distances of the plurality of pattern cells from the first pattern cell and by the pattern density of the first pattern cell to obtain a respective weighted pattern density for a respective one of the plurality of pattern cells; and
computer readable program code that sums the respective weighted pattern densities and dividing by a number of cells in the selected plurality of pattern cells to obtain the effective pattern density of the first pattern cell.

32. A computer program product according to claim 29 wherein the computer readable program code that determines comprises computer readable program code that determines a scaled respective pattern density for a respective pattern cell in the grid that is scaled as a function of fabrication processes that are used to fabricate the integrated circuit.

33. A computer program product according to claim 32 wherein the computer readable program code that determines a scaled respective pattern density comprises computer readable program code that changes a pattern width of a respective pattern cell in the grid as a function of fabrication processes that are used to fabricate the integrated circuit.

34. A computer program product according to claim 32 wherein the computer readable program code that determines a scaled respective pattern density comprises computer readable program code that multiplies the respective pattern density for a respective pattern cell in the grid by a scaling factor that is a function of fabrication processes that are used to fabricate the integrated circuit.

35. A computer program product according to claim 29 wherein the layer is a patterned layer upon which a planarization layer is formed and planarized using Chemical-Mechanical Polishing (CMP), the computer program product further comprising:
computer readable program code that determines a thickness of the planarization layer as a function of CMP polishing time, based on the effective pattern density, in response to the computer readable program code that calculates.

36. A computer program product according to claim 35 wherein the computer readable program code that determines a thickness comprises computer readable program code that determines a thickness H of the planarization layer as a function of CMP polishing time t according to the following formula:

$$H(i, j) = H_0(i, j) + X_0 - kVPt + h_0\left[D(i, j)\exp\left(\frac{-kVtE}{U}\right) + D_p(i, j)\left\{1 - \exp\left(\frac{-kVtE}{U}\right)\right\}\right]$$

where i and j are integers which represent a position of each pattern cell in an x-axis direction and a y-axis direction, respectively, in an integrated circuit, $H_0$ represents an initial total height beneath the planarization layer, $X_0$ represents the thickness of the planarization layer, $h_0$ represents an initial step difference, D represents the pattern density of each pattern cell, $D_p$ represents the effective pattern density of each pattern cell, k represents the Preston coefficient, V represents the relative velocity of a wafer in which the integrated circuit is located with respect to a polishing pad, P represents a polishing pressure of the wafer on the polishing pad, t presents a polishing time, E represents the Young's Modulus of the polishing pad, and U represents the thickness of the polishing pad.

37. A computer program product according to claim 36 wherein the integrated circuit is fabricated in a wafer along with other integrated circuits, wherein at least one of the parameters of the formula vary as a function of location of the integrated circuit in the wafer and wherein the computer program product further comprises:

computer readable program code that determines the at least one of the parameters as a function of the location of the integrated circuit in the wafer, the computer readable program code that determines a thickness being responsive to the computer readable program code that determines at least one of the parameters.

38. A computer program product according to claim 37 wherein the at least one of the parameters of the formula that vary as a function of location of the integrated circuit in the wafer comprise parameters V and P, and wherein the computer readable program code that determines at least one of the parameters comprises computer readable program code that calculates the parameters V and P by the following second formula:

$$V(R_c) = \int_O^T \frac{\vec{V}(R_c, t)dt}{T}$$

$$= \frac{2\pi L \Omega_p}{60} \int_0^1 \left\{ \left(1 - \frac{\Omega_c}{\Omega_p}\right)^2 \left(\frac{R_c}{L}\right)^2 + 2\left(1 - \frac{\Omega_c}{\Omega_p}\right)\left(\frac{R_c}{L}\right)\cos(2\pi t + 1) \right\}^{1/2} dt$$

$$\text{and} \quad P(r_w) = a\left\{P_1 - (P_1 - P_0)\left(\frac{r_w}{R}\right)^2\right\}$$

respectively, where $R_c$ represents a distance from an axis of rotation of the polishing pad to each pattern cell of the wafer, L represents a distance between the axis of rotation of the polishing pad and an axis of rotation of the wafer, $\Omega_p$ represents a rotational velocity of the polishing pad, $\Omega_c$ represents a rotational velocity of the wafer, t represents a polishing time, $r_w$ represents a distance from the center of the wafer to each pattern cell, $P_i$ represents a pressure at the center of the wafer, $P_0$ represents a pressure at the edge of the wafer, and R represents a radius of the wafer.

39. A computer program product according to claim 37 wherein the parameters that vary as a function of location of the integrated circuit in the wafer are obtained from measurements that are carried out after performing chemical-mechanical polishing on a bare wafer.

40. A computer program product according to claim 29 further comprising:

computer readable program code that determines a stop time for chemical mechanical polishing a layer on the patterned layer, based upon the effective pattern density.

41. A computer program product according to claim 29 further comprising:

computer readable program code that determines monitoring points for chemical mechanical polishing a layer on the patterned layer, based upon the effective pattern density.

42. A computer program product according to claim 29 further comprising:

computer readable program code that determines a portion of a layer on the patterned layer that will thin during chemical mechanical polishing the layer, based upon the effective pattern density;

computer readable program code that adds a dummy pattern to a corresponding portion of the patterned layer; and wherein the computer readable program code that defines is responsive to the layout data and to the dummy pattern.

* * * * *